(12) United States Patent
Endo et al.

(10) Patent No.: US 8,771,483 B2
(45) Date of Patent: *Jul. 8, 2014

(54) COMBINATORIAL PROCESS SYSTEM

(75) Inventors: Rick Endo, San Carlos, CA (US); Kurt Weiner, San Jose, CA (US); Indranil De, Mountain View, CA (US); James Tsung, Milpitas, CA (US); Maosheng Zhao, San Jose, CA (US); Jeremy Cheng, Sunnyvale, CA (US)

(73) Assignee: Intermolecular, Inc., San Jose, CA (US)

( * ) Notice: Subject to any disclaimer, the term of this patent is extended or adjusted under 35 U.S.C. 154(b) by 1260 days.

This patent is subject to a terminal disclaimer.

(21) Appl. No.: 12/027,980

(22) Filed: Feb. 7, 2008

(65) Prior Publication Data

US 2009/0061108 A1 Mar. 5, 2009

Related U.S. Application Data

(60) Provisional application No. 60/969,955, filed on Sep. 5, 2007.

(51) Int. Cl.
*C23C 14/00* (2006.01)
*C23C 16/50* (2006.01)
*C25B 11/00* (2006.01)
*H01L 21/306* (2006.01)

(52) U.S. Cl.
USPC ........ 204/298.27; 204/298.11; 118/723 CB; 118/730; 156/345.3; 156/345.55; 505/33

(58) Field of Classification Search
USPC .......... 118/500; 204/297.05, 298.23, 298.11; 506/33
See application file for complete search history.

(56) References Cited

U.S. PATENT DOCUMENTS

| | | | | |
|---|---|---|---|---|
| 4,310,614 A | * | 1/1982 | Connell et al. | 430/270.12 |
| 5,985,356 A | * | 11/1999 | Schultz et al. | 427/8 |
| 6,458,285 B1 | * | 10/2002 | Iyama et al. | 216/66 |
| 6,491,759 B1 | * | 12/2002 | Christen et al. | 118/722 |
| 7,018,479 B2 | | 3/2006 | Goodwin | |
| 7,125,587 B2 | * | 10/2006 | Viviani | 427/525 |
| 2004/0082251 A1 | | 4/2004 | Bach et al. | |
| 2005/0034979 A1 | * | 2/2005 | Druz et al. | 204/298.02 |

FOREIGN PATENT DOCUMENTS

JP 01-312835 A 12/1989

\* cited by examiner

*Primary Examiner* — Parviz Hassanzadeh
*Assistant Examiner* — Nathan K Ford

(57) ABSTRACT

A combinatorial processing chamber is provided. The combinatorial processing chamber is configured to isolate a radial portion of a rotatable substrate support, which in turn is configured to support a substrate. The chamber includes a plurality of clusters process heads in one embodiment. An insert having a base plate disposed between the substrate support and the process heads defines a confinement region for a deposition process in one embodiment. The base plate has an opening to enable access of the deposition material to the substrate. Through rotation of the substrate and movement of the opening, multiple regions of the substrate are accessible for performing combinatorial processing on a single substrate.

15 Claims, 17 Drawing Sheets

COMBINATORIAL PROCESS SYSTEM

CLAIM OF PRIORITY

This application claims the benefit of U.S. Application Ser. No. 60/969,955 filed Sep. 5, 2007, which is incorporated by reference in its entirely for all purposes.

BACKGROUND

Deposition processes are commonly used in semiconductor manufacturing to deposit a layer of material onto a substrate. Processing is also used to remove layers, defining features (e.g., etch), preparing layers (e.g., cleans), doping or other processes that do not require the formation of a layer on the substrate. Processes and process shall be used throughout the application to refer to these and other possible known processes used for semiconductor manufacturing and any references to a specific process should be read in the context of these other possible processes. In addition, similar processing techniques apply to the manufacture of integrated circuits (IC) semiconductor devices, flat panel displays, optoelectronics devices, data storage devices, magneto electronic devices, magneto optic devices, packaged devices, and the like. As feature sizes continue to shrink, improvements, whether in materials, unit processes, or process sequences, are continually being sought for the deposition processes. However, semiconductor companies conduct R&D on full wafer processing through the use of split lots, as the deposition systems are designed to support this processing scheme. This approach has resulted in ever escalating R&D costs and the inability to conduct extensive experimentation in a timely and cost effective manner.

While gradient processing has attempted to provide additional information, the gradient processing suffers from a number of shortcomings. Gradient processing relies on defined non-uniformity which is not indicative of a conventional processing operation and therefore cannot mimic the conventional processing. Under gradient processing different amounts of material (or dopant) is deposited across the entire substrate or a portion of the substrate. This approach is also used for a deposition system having a carousel of targets which may or may not be used for co-sputtering purposes. In each of these systems, the uniformity of the region being deposited, as well as cross contamination issues when performing more than one deposition process render these techniques relatively ineffective for combinatorial processing.

Thus, an improved technique for accommodating the evaluation of multiple different process variations on a single substrate is provided to more efficiently evaluate the viability of different materials, unit processes, or process sequences.

BRIEF DESCRIPTION OF THE DRAWINGS

The present invention will be readily understood by the following detailed description in conjunction with the accompanying drawings, and like reference numerals designate like structural elements.

DETAILED DESCRIPTION

Figure 1A:
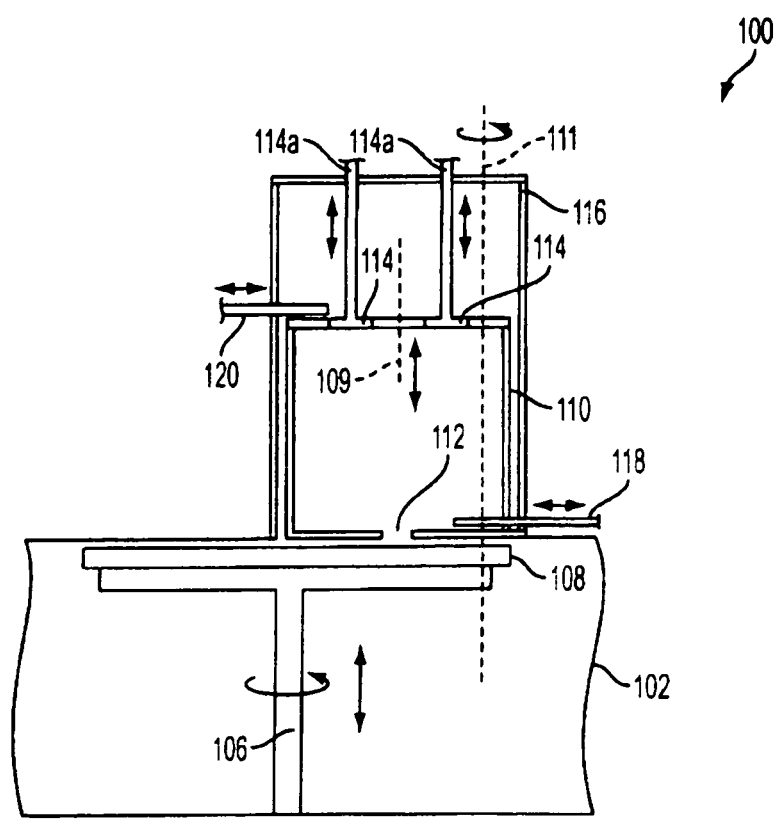
FIG. 1A is a simplified schematic diagram illustrating a processing chamber configured to combinatorially process a substrate disposed therein in accordance with one embodiment of the invention.

The embodiments described herein provide a method and system for a process chamber configured to combinatorially process a substrate. It will be apparent to one skilled in the art, that the present invention may be practiced without some or all of these specific details. In other instances, well known process operations have not been described in detail in order not to unnecessarily obscure the present invention.

The embodiments described below provide details for a multi-region processing system and associated processing heads that enable processing a substrate in a combinatorial fashion. Thus, different regions of the substrate may have different properties, which may be due to variations of the materials, unit processes (e.g., processing conditions or parameters) and process sequences, etc. Within each region the conditions are preferably substantially uniform so as to mimic conventional full wafer processing within each region, however, valid results can be obtained for certain experiments without this requirement. In one embodiment, the different regions are isolated so that there is no inter-diffusion between the different regions.

In addition, the combinatorial processing of the substrate may be combined with conventional processing techniques where substantially the entire substrate is uniformly processed (e.g., subjected to the same materials, unit processes and process sequences). Thus, the embodiments described herein can pull a substrate from a manufacturing process flow, perform combinatorial deposition processing and return the substrate to the manufacturing process flow for further processing. Alternatively, the substrate can be processed in an integrated tool that allows both combinatorial and conventional processing in various chambers attached around a central chamber. Consequently, in one substrate, information concerning the varied processes and the interaction of the varied processes with conventional processes can be evaluated. Accordingly, a multitude of data is available from a single substrate for a desired process.

The processing chamber described herein may be optimized for half of the substrate as a radial portion is defined through the insert in one embodiment. Thus, uniformity of the deposited layer is improved through this confinement as the aspect ratio is essentially half of that for processing a full substrate under conventional conditions, where the entire substrate surface must be considered. Furthermore, the impact on the uniformity of the distance from the targets to the substrate, which is relatively large to begin with, is accentuated by the confinement of the processing region. However, the chamber may cover a larger or smaller portion of the substrate and still operate in accordance with the inventions described herein. For example, the chamber size may be dictated by the number of heads. Or, in the embodiment where the process kit shield rotates about an off-axis, the chamber will need to be large enough to encompass the movement path about the kit shield. However, the reduced size of the reaction region, defined by the process kit shield in the preferred embodiments can have many benefits for construction and use of the tool, however, the process kit shield is not required to implement the invention.

As further discussed below, a substrate holder rotates a substrate in conjunction with a base plate having an opening to provide regional access to the surface of a substrate for combinatorial processing within the chamber. In one embodiment, the base plate may be rotated about an axis different from the axis of the substrate support so that the entire substrate can be accessed. In another embodiment, a linear mask may be utilized to define the location and shape of a processing region over the substrate. In addition, other combinations and variations are possible based on the teachings of the invention set forth herein. It should be appreciated that the shape of the regions that are processed may include isolated circles, rings, ring segments or arcs, quadrilateral or other polygons, pie shaped pieces, etc., as discussed in the embodiments described below. To further modify the area to be processed, a shadow mask, other mask, or masking technique may be included in addition to the aperture to define specific features or portions of the regions defined by the system.

The embodiments described herein are directed to various applications, including deposition, which includes physical vapor deposition (PVD), chemical vapor deposition (CVD), atomic layer deposition (ALD), as well as other applications, such as etch, doping, surface modification or preparation (e.g., cleaning processes or monolayers depositing), etc. In addition, the inventions described herein will work for other flux based systems. It should be further appreciated that the embodiments described below are techniques optimized for combinatorial processing of a substrate. The movement and/or rotation of a relatively small aperture (as compared to the overall area of the substrate) defines a region and along with the rotation of the substrate enables access to the entire surface of the substrate. Alternatively, the process head or a cluster of process heads could be rotated in a circular fashion and the substrate could be moved in a relative x-y direction or rotated to enable access to the entire surface through the relative aperture and substrate movement.

FIG. 1A is a simplified schematic diagram illustrating a processing chamber configured to combinatorially process a substrate disposed therein in accordance with one embodiment of the invention. Processing chamber 100 includes a bottom chamber portion 102 disposed under top chamber portion 116. Within bottom portion 102 substrate support 106 is configured to hold a substrate 108 disposed thereon and can be any known substrate support, including but not limited to a vacuum chuck, electrostatic chuck or other known mechanisms. Substrate support 106 is capable of rotating around a central axis of the substrate support. In one embodiment, substrate support 106 rotates approximately 185 degrees to provide full access to the surface of a substrate. In another embodiment substrate support 106 rotates 360 degrees. In addition, substrate support 106 may move in a vertical direction or in a planar direction. It should be appreciated that the rotation and movement in the vertical direction or planar direction may be achieved through known drive mechanisms which include magnetic drives, linear drives, worm screws, lead screws, a differentially pumped rotary feed through drive, etc.

Substrate 108 may be a conventional round 200 millimeter, 300 millimeter or any other larger or smaller substrate/wafer size. In other embodiments, substrate 108 may be a square, rectangular, or other shaped substrate. One skilled in the art will appreciate that substrate 108 may be a blanket substrate, a coupon (e.g., partial wafer), or even a patterned substrate having predefined regions. In another embodiment, substrate 108 may have regions defined through the processing described herein. The term region is used herein to refer to a localized area on a substrate which is, was, or is intended to be used for processing or formation of a selected material. The region can include one region and/or a series of regular or periodic regions pre-formed on the substrate. The region may have any convenient shape, e.g., circular, rectangular, elliptical, wedge-shaped, etc. In the semiconductor field a region may be, for example, a test structure, single die, multiple die, portion of a die, other defined portion of substrate, or a undefined area of a, e.g., blanket substrate which is defined through the processing.

Top chamber portion 116 of chamber 100 in FIG. 1A includes process kit shield 110, which defines a confinement region over a radial portion of substrate 108. Process kit shield 110 is in essence a sleeve having a base (optionally integral with the shield) and an optional top within chamber 100 that may be used to confine a plasma generated therein. The generated plasma will dislodge particles from a target to process (e.g., be deposited) on an exposed surface of substrate 108 to combinatorially process regions of the substrate in one embodiment. Process kit shield 110 is capable of being moved in and out of chamber 100, i.e., the process kit shield is a replaceable insert. Process kit shield 110 includes an optional top portion, sidewalls and a base. In one embodiment, process kit shield 110 is configured in a cylindrical shape, however, the process kit shield may be any suitable shape and is not limited to a cylindrical shape.

The base of process kit shield 110 includes an aperture 112 through which a surface of substrate 108 exposed for deposition or some other suitable semiconductor processing operation. Within top portion 116 is cover plate 118 which is moveably disposed over the base of process kit shield 110. Cover plate 118 may slide across a bottom surface of the base of process kit shield 110 in order to cover or expose aperture 112 in one embodiment. In another embodiment, cover plate 118 is controlled through an arm extension which moves the cover plate to expose or cover aperture 112 as will be described in more detail below. It should be noted that although a single aperture is illustrated, multiple apertures may be included. Each aperture may be associated with a dedicated cover plate or a cover plate can be configured to cover more than one aperture simultaneously or separately. Alternatively, aperture 112 may be a larger opening and plate 118 may extend with that opening to either completely cover it or place one or more fixed apertures within that opening for processing the defined regions.

The optional top plate of sleeve 110 of FIG. 1A may function as a datum shield as will be described further below. Process heads 114 (also referred to as deposition guns) are disposed within slots defined within the datum shield in accordance with one embodiment of the invention. Where a datum shield is utilized in the chamber, a datum shield slide cover plate 120 may be included. Datum shield slide cover plate 120 functions to seal off a deposition gun when the deposition gun may not be used for the processing. For example, two deposition guns 114 are illustrated in FIG. 1A. Process heads 114 are moveable in a vertical direction so that one or both of the guns may be lifted from the slots of the datum shield. While two process heads are illustrated, any number of process heads may be included, e.g., three or four process heads may be included. Where more than one process head is included, the plurality of process heads may be referred to as a cluster of process heads. In addition, the cluster of process heads may be rotatable around an axis as discussed with reference to FIGS. 2 and 3. Slide cover plate 120 can be transitioned to isolate the lifted process heads from the processing area defined within process kit shield 110. In this manner, the process heads are isolated from certain processes when desired. It should be noted that while one slide cover plate 120 is illustrated, multiple slide cover plates may be included so that each slot or opening of the datum shield is associated with a cover plate. Alternatively, slide cover plate 120 may be integrated with the top of the shield unit 110 to cover the opening as the process head is lifted or individual covers can be used for each target. In addition, certain aspects of the chamber described with respect to FIG. 4 may be integrated into this chamber design.

Top section 116 of chamber 100 of FIG. 1A includes sidewalls and a top plate which house process kit shield 110. Arm extensions 114a, which are fixed to process heads 114 extend through the region defined within top portion 116. Arm extensions 114a may be attached to a suitable drive, e.g., lead screw, worm gear, etc., configured to vertically move process heads 114 toward a top plate of top portion 116. Arm extensions 114a may be pivotably affixed to process heads 114 to enable the process heads to tilt relative to a vertical axis. In one embodiment, process heads 114 tilt toward aperture 112. In another embodiment, arm extensions 114a are attached to a bellows that allows for the vertical movement and tilting of process heads 114. Where a datum shield is utilized, the opening are configured to accommodate the tilting of the process heads. In one embodiment, the process heads are tilted by ten degrees or less relative to the vertical axis. It should be appreciated that the tilting of the process head enables tuning so that the gun may be tilted toward an aperture in the base plate to further enhance uniformity of a layer of material deposited through the aperture.

As illustrated in FIG. 1A, process kit shield 110 is moveable in a vertical direction and is configured to rotate around an axis of the process kit shield. It should be appreciated that the axis 111 around which process kit shield 110 rotates is offset from both the axis around which substrate support 106 rotates and an axis 109 of a cluster of process heads in one embodiment. In this manner, a plurality of regions on substrate 108 may be exposed for combinatorial processing as described further with reference to FIG. 4. As process kit shield 110 rotates the relative position of the process heads 114 and the aperture 112 remains the same, thus the processing of the region on substrate 108 will be more uniform from site to site and not contain variability due to process head angle or relative positioning. While process heads 114 are described as clustered on the same axis as aperture 112, additional heads may be offset from the cluster of heads for doping, implantation or deposition of small amounts of a material, e.g., 1-10% without limitation. An alternative embodiment to provide access to regions on the entire substrate may include linear movement of upper chamber 116 as opposed to movement in an arc as shown in the figures.

Figure 1B:
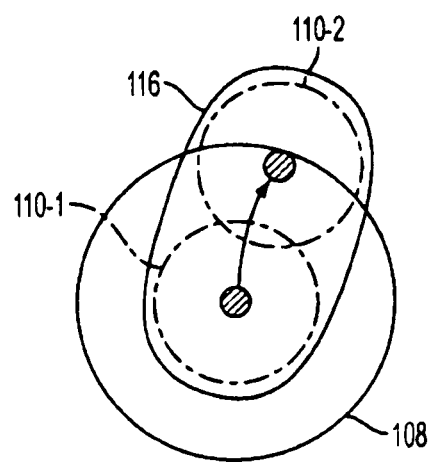
FIG. 1B is a simplified schematic diagram of exemplary different positions of the process kit shield in accordance with one embodiment of the invention.
Figure 2:
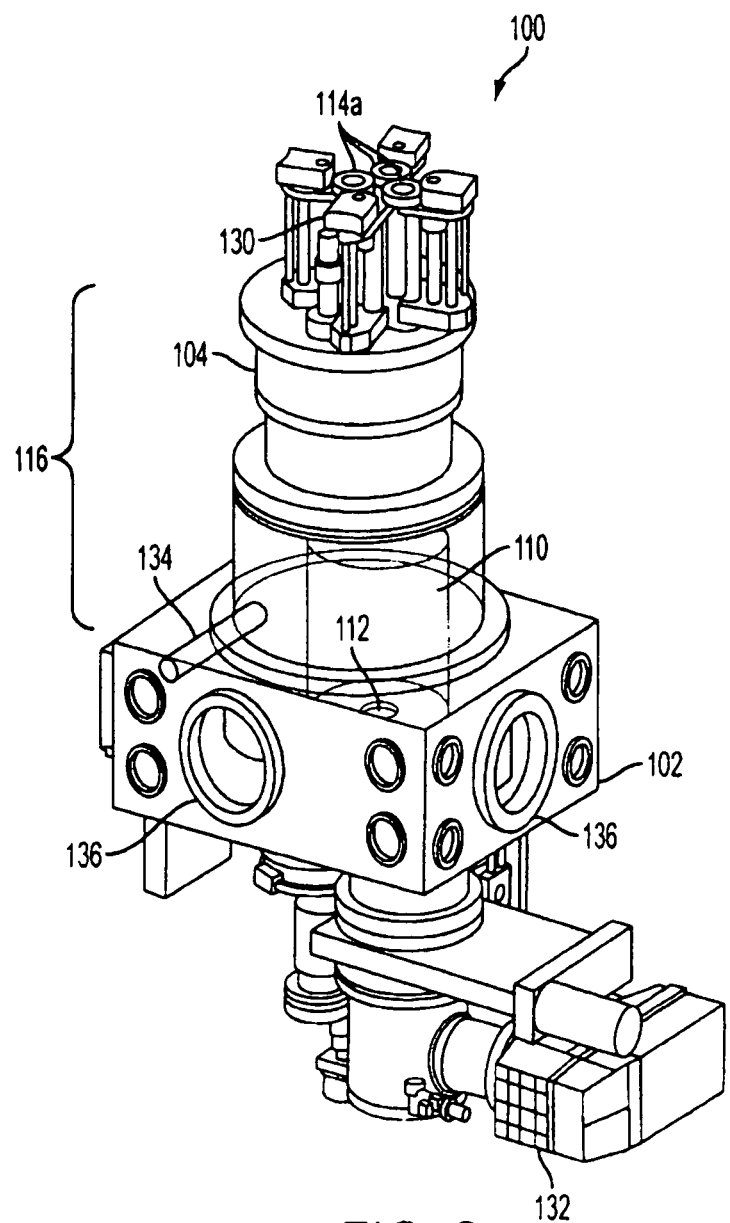
FIG. 2 is a simplified schematic diagram illustrating an alternative view of a combinatorial processing chamber in accordance with one embodiment of the invention.

FIG. 1B is a simplified schematic diagram of exemplary different positions of the process kit shield in accordance with one embodiment of the invention. Process kit shield 110 may move within top section 116 of the chamber. As discussed herein, process kit shield 110 may rotate about an axis to move between positions 110-1 and 110-2. Alternatively, the process kit shield may move linearly between positions 110-1 and 110-2. It should be appreciated that top section 116 may be any suitable shape to accommodate this movement, including circular, kidney shaped, oval, rectangular, etc. In addition, the relative size of the process kit shield may be based on the number of heads and other design factors, such as the type of movement, e.g., linear vs. rotational. Thus, the process kit shield may be smaller, larger, or the same size as substrate 108 depending on the number and configuration of process heads as well as other design factors, FIG. 2 is a simplified schematic diagram illustrating another view of a combinatorial processing chamber in accordance with one embodiment of the invention. Process chamber 100 includes bottom portion 102 disposed under top portion 116. The substrate support referred to in FIG. 1 is housed within bottom portion 102. Bottom portion 102 of FIG. 2 includes access ports 136 which may be utilized for access to the chamber for pulling a vacuum, or other process monitoring operations. In addition, bottom portion 102 includes slot valve 134 which enables access for a substrate into and out of bottom chamber 102. In one embodiment, process tool 100 may be part of a cluster tool as described further with regard to FIG. 14. One skilled in the art will appreciate that a robot may be utilized to move substrates into and out of process chamber 100 through slot valve 134. Process kit shield 110 is disposed within top portion 116. In the embodiment described with regard to FIG. 2, top portion 116 includes a rotary stage 104 which is utilized to rotate the process kit shield 110, if included, with the process heads. Process heads disposed within top portion 116 are attached to corresponding arm extensions 114a which protrude through a top surface of rotary stage 104. Also protruding through a top surface of rotary stage 104 is heat lamp 130 which is disposed within top portion 116 of chamber 100 in order to supply heat for processing within the chamber.

Drive 132 of FIG. 2 may be used to provide the rotational means for rotating a substrate support disposed within bottom portion 102. In addition, drive 132 may provide the mechanical means for raising or lowering the substrate support. Within the embodiment described by FIG. 2, four process guns are included which rotate with top portion 116 on a different axis than substrate support 106 as described elsewhere herein. In addition, a substrate disposed under a base of process kit shield 110 and on top of a substrate support may be rotated through rotational motion provided by the substrate support. An axis of process kit shield 110, an axis of the process heads and an axis of the substrate support are offset from each other in order to achieve a pattern of regions or an array of regions on the substrate as illustrated in more detail with regard to FIG. 4. The processing defines regions on a substrate in one embodiment. In another embodiment, the regions are predefined and the processing heads provide further processing for the regions. The substrate is processed through aperture 112 located through the base of process kit shield 110 in this embodiment. As described above, process kit shield 110 will confine a plasma used for a physical vapor deposition (PVD) or other flux based processing. The array or cluster of deposition guns within top portion 116 enables co-sputtering of different materials onto a layer of a substrate, as well as a single material being deposited and various other processes. Accordingly, numerous combinations of materials or multiple deposition guns having the same material, or any combination thereof may be applied to the different regions so that an array of differently processed regions results.

The chamber described with regards to FIGS. 1 and 2 may be incorporated into a cluster-tool in which conventional processing tools are included. Thus, the substrate may be conventionally processed (i.e., the whole wafer subject to one process or set of processes to provide uniform processing across the wafer) and placed into the combinatorial processing tool (or moved within the tool as described with respect to FIG. 14) illustrated herein in order to evaluate different processing techniques on a single substrate. Furthermore, the embodiments described herein provide for a "long throw" chamber in which a distance from a top surface of a substrate being processed and the surface of a target on the deposition guns is greater than four diameters of the targets. For example, a target may have a size of two to three inches which would make the distance from a top surface of the substrate being processed and the target between about 8 and about 12 inches in one embodiment. In another embodiment, the surface of a target on the deposition guns is greater than six diameters of the targets. This distance will enhance the uniformity of the material being deposited within the region defined by aperture 112 over the substrate. That is, while the substrate may have differently processed regions, each region will be substantially locally uniform in order to evaluate the variations enabled through the combinatorial processing. It should be noted that the depositions rate will decrease with the increase in target to substrate distance. This increase in distance would negatively impact throughput for a production tool and therefore is not considered for conventional processing tool. However, the resulting uniformity and multitude of data obtained from processing the single substrate combinatorially far outweighs any throughput impact due to the decrease in the deposition rate. It is noted, that the chamber does not require long throw to be effective, but such an arrangement is a configuration that may be implemented.

Figure 3:
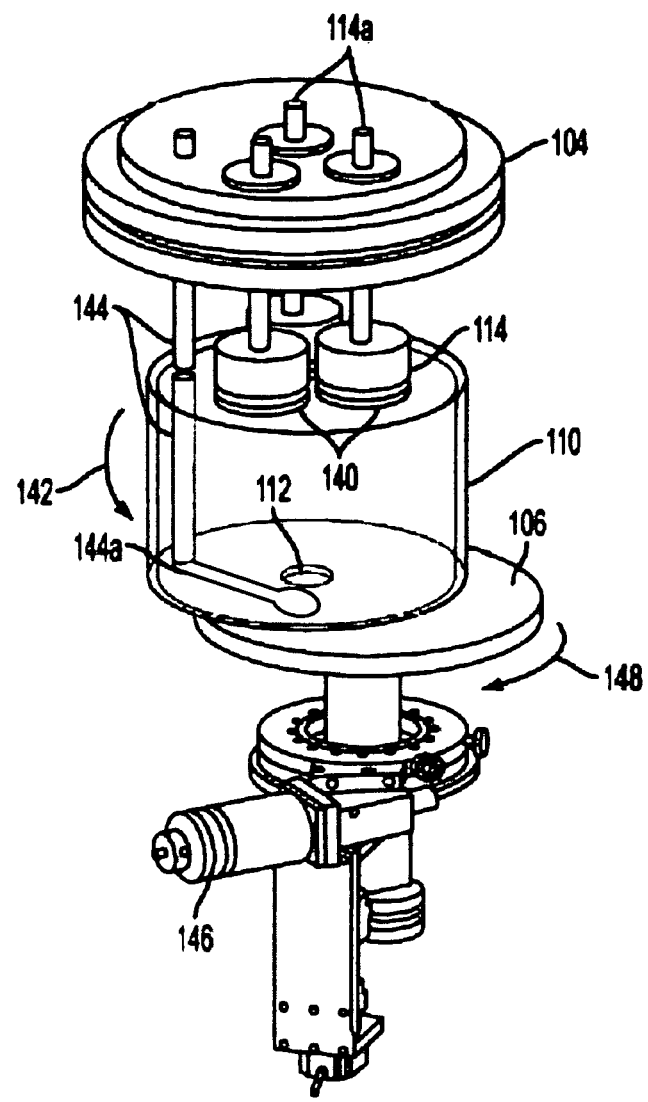
FIG. 3 is a simplified schematic diagram illustrating various components of the process chamber of FIG. 2 in more detail in accordance with one embodiment of the invention.

FIG. 3 is a simplified schematic diagram illustrating various components of the process chamber of FIG. 2 in more detail in accordance with one embodiment of the invention. In FIG. 3, the rotary stage includes a top plate through which arm extensions 114a protrude. Arm extensions 114a are affixed to process heads 114. For the embodiment where process heads 114 are deposition guns, targets 140 attach thereto. One skilled in the art will appreciate that targets 140 may be coupled to the heads 114 through magnetism in one embodiment. Deposition guns 114 may be commercially available guns such as those through the KURT J. LESKER COMPANY or from MEIVAC Inc. While three deposition guns are clustered within the embodiment of FIG. 3, any suitable number of deposition heads may be included within the process tool. It should be appreciated that process heads 114 are clustered over a radial portion of the substrate defined by process kit shield 110. Considerations such as the size of process heads, confinement area defined by process kit shield 110, and the substrate size, will impact the number of deposition heads capable of fitting in the system.

Arm 144 protrudes through the top plate of the rotary stage and into the confinement area defined within process kit shield 110. Arm 144 will extend to a base of process kit shield 110 and radially extend over a surface of the base with section 144a that provides a cover for aperture 112. Thus, a rotary mechanism which will turn or twist arm 144 can be used to cover and uncover aperture 112. In this manner, aperture 112 can be sealed so that during a burn in or other processing operation where it is beneficial to isolate a substrate disposed on substrate support 106, the aperture 112 may be closed by rotating arm 144. Other closure mechanisms can also be applied, such as the cover plate described in FIG. 1.

Figure 4:
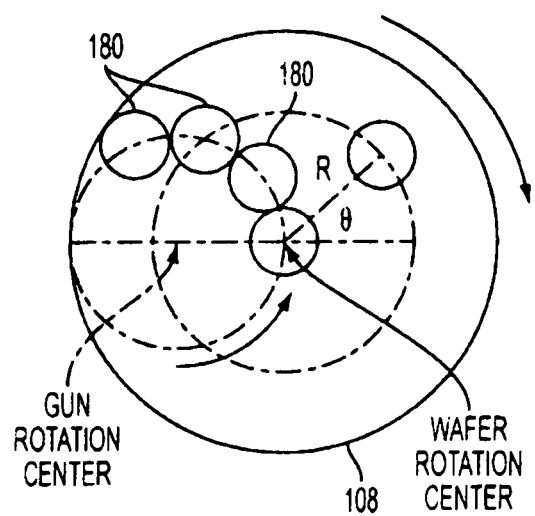
FIG. 4 is a simplified schematic diagram illustrating a pattern achieved through the ability to rotate both the process heads and the substrate in accordance with one embodiment of the invention.

As illustrated in FIG. 3, rotary stage 104 and process kit shield 110 rotate in order to move aperture 112 over different regions of a substrate disposed on substrate support 106. It is preferable, but not required, that the axis of the cluster of process heads is the same as that of the aperture(s), so that more uniform processing results will be obtained across the combinatorial processed regions and, therefore, the results can be explained by the different processing as opposed to the angle or location of the process heads relative to the regions. In addition, substrate support 106 will rotate around its axis so that a number of regions may be exposed on a surface of a substrate being processed as illustrated in FIG. 4. Drive mechanism 146 may provide the rotational force to rotate substrate support 106. In addition a linear drive may be coupled to substrate support 106 in order to enable vertical displacement of the substrate support. Thus, through the rotational movement of process kit shield 110 and the corresponding aperture 112 in the base of the process kit shield, in combination with the rotational movement of substrate support 106, any region of a substrate may be accessed for combinatorial processing. The rotational movement of process kit shield 110 provides radial movement of aperture 112 across a substrate disposed on substrate support 106. It should be noted that the axis of rotation for process kit shield 110 is offset from the axis of rotation of substrate support 106.

FIG. 4 is a simplified schematic diagram illustrating a pattern achieved through the ability to rotate both the process heads and the substrate in accordance with one embodiment of the invention described with reference to FIGS. 1-3. Substrate 108 may be rotated and the array or cluster of process heads, e.g., deposition guns, may be rotated. As illustrated, the axis of rotation for substrate 108 is offset from the axis of rotation of the gun or cluster of guns, and both of the aforementioned axes of rotation are offset from an axis of rotation of the process kit shield in one embodiment. As the process kit and the process heads or guns rotate, radial movement across the substrate surface is provided in order to define a number of regions 180. It should be noted that an opening, i.e., the aperture, within the base of the process kit shield may be centered or offset from a center of the base in one embodiment, but is preferably, as mentioned above, axially aligned with the process heads and such aligned is maintained during the rotation of the process kit (though the system may include additional process heads for doping, implantation or other processing that are not axially aligned or are positioned at an angle. In addition, the aperture may be of any shape as mentioned elsewhere. For example, if the aperture 112 is rectangular then the aperture may rotate in a fixed position in the base plate so that the rectangle regions are created in an ordered array (i.e., nearly parallel region borders as opposed to various angles between the region borders) when the process heads 114 are rotated. Rotation of substrate 108 will further enable access to substantially the entire substrate and allow processing or deposition over multiple regions of the substrate. The regions may overlap or the regions can be isolated. Of course, some combination of overlapping and isolated regions is possible.

Figure 5:
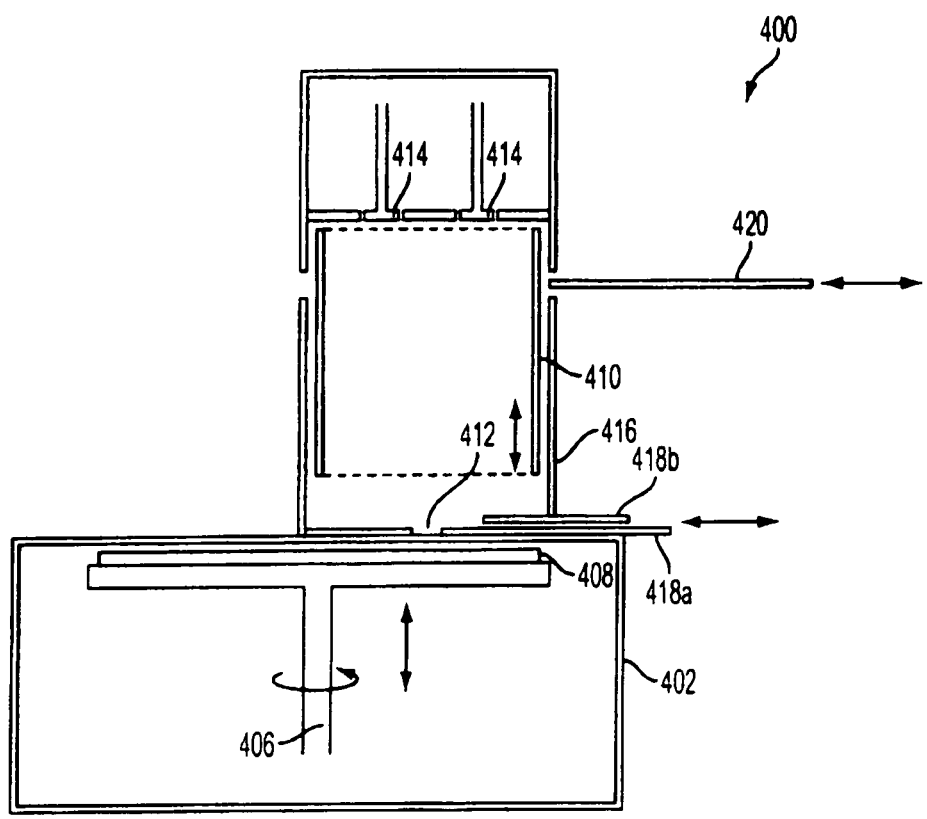
FIG. 5 is a simplified schematic diagram illustrating a cross sectional view of the process kit shield with the arm cover plate in accordance with one embodiment of the invention.

FIG. 5 illustrates an alternative embodiment of the invention. Combinatorial processing chamber 400 includes upper chamber 416 and lower chamber 402. Lower chamber 402 includes substrate support 406, which may rotate as describe above, for supporting substrate 408. Upper chamber 416 includes an outer wall, a base plate having an opening (described in more detail below), a moveable shield 410, processing head 414 and an optional datum shield. Opening 412, linear mask 418a and slideable plate 418b are described in more detail below. FIG. 5 illustrates an alternative embodiment of cover plate 420 and kit shield 410. In this embodiment, kit shield 410 is moveable vertically. When in the up position, as shown, kit shield 410 blocks the valve providing access for cover plate 420. If a change of heads is required, kit shield 410 can be moved down and cover plate 420 moved into the chamber to provide a break between the lower portion of upper chamber 416 and the upper portion containing process head 414. In this manner process heads may be changed, serviced, or otherwise modified for further processing without losing the vacuum state in the lower portion of chamber 416 or exposing it to atmosphere. This chamber implementation may be used with the chamber of FIG. 1 and various components may be used interchangeably as would be understood by one of skill in the art based upon the detailed description of the invention contained herein.

Figure 6:
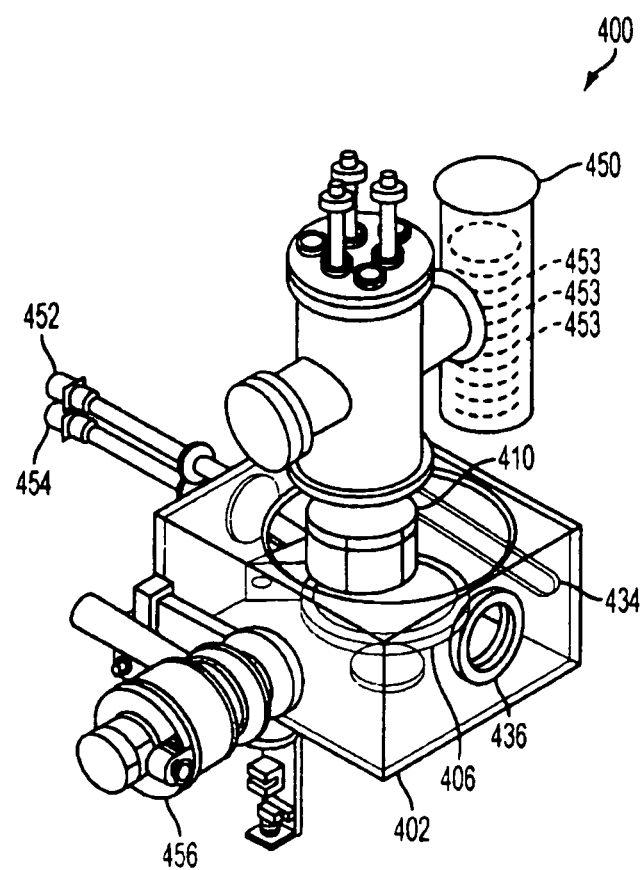
FIG. 6 is a simplified schematic diagram illustrating an alternative processing chamber in accordance with one embodiment of the invention.

FIG. 6 is a simplified schematic diagram illustrating an alternative processing chamber in accordance with one embodiment of the invention. Bottom portion 402 of process chamber 400 includes access port 436 and slot valve 434. Slot valve 434 provides access for a substrate into and out of process chamber 400. Vacuum pump 456 is attached to an access port in order to provide the ultra high vacuum conditions necessary for certain processing operations, such as deposition operations, occurring within chamber portion 402. Process kit sleeve 410 is disposed within processing chamber 400 and top portion 406 is slightly lifted in order to provide a view of the process kit shield. Rods 452 and 454 extend from chamber portion 402 and provide movement to a linear mask and corresponding flag which will either expose an aperture or close an aperture defined through a base of process kit shield 410. Further details on the mechanism for rods 452 and 454 are provided with reference to FIGS. 7A through 9.

Top chamber portion 406 includes an extension 450 which houses a plurality of targets 453. It should be appreciated that the plurality of targets 453 may be moved into process chamber 400 and placed onto corresponding deposition heads. One skilled in the art will appreciate that a robot may remove a target from a deposition gun and place the target within storage extension 450. After storing the removed target the robot may pick a different target from stored targets 453 and place that target onto the corresponding process head. In one embodiment, the targets magnetically attach to the process head. In this embodiment, the robot may grip the target and the process head retracts so that the target separates from the process head for removal. It should be appreciated that numerous types of materials may be deposited on a single substrate within the processing chamber in a combinatorial fashion through the embodiments described herein. Multiple heads may be used to co-sputter different materials onto different regions of a substrate and/or processing conditions during co-sputtering of the different materials. Accordingly, a single substrate can yield data for numerous combinations of materials, process conditions, process sequences, and unit processes.

Figure 7B:
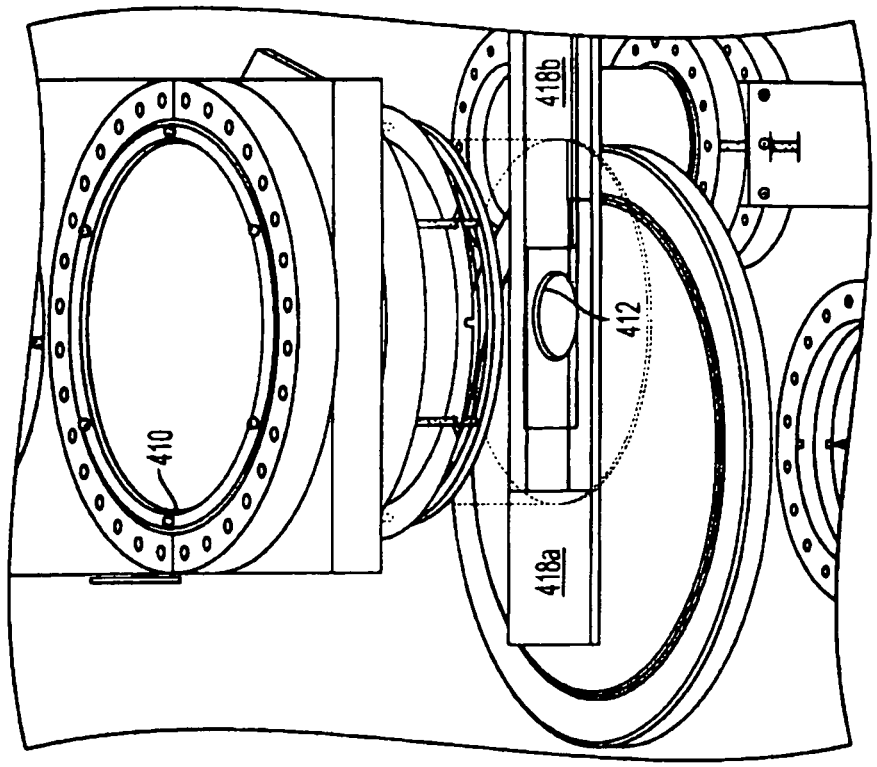
FIGS. 7A and 7B illustrate further details of the linear mask embodiment mentioned with regard to FIG. 6 in accordance with one embodiment of the invention.
Figure 7A:
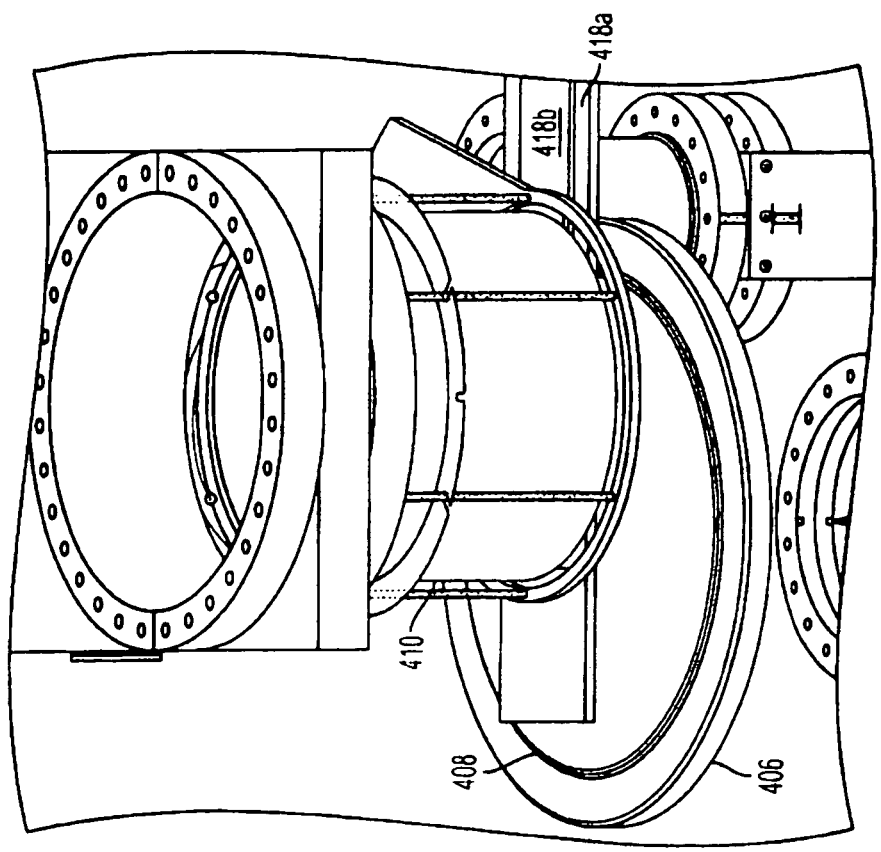

FIGS. 7A and 7B illustrate further details of the linear mask embodiment mentioned with regard to FIG. 6 in accordance with one embodiment of the invention. In FIG. 7A, substrate support 406 has substrate 408 disposed therein. Process shield 410 confines a processing region over a radial portion of substrate 408. Linear mask 418a provides support for slideable cover 418b. In addition, as illustrated in FIG. 7B, linear mask 418a has an aperture 412 defined therethrough. Aperture 412 is exposed or covered through movement of cover plate 418b. Linear mask 418a may have a number of apertures 412 defined therethrough and is not limited to a single aperture. In addition, the shape of aperture 412 is any suitable shape and is not limited to a circular shape, but may be a quadrilateral oval, polygon, arc, wedge or other shape. Linear mask 418a is affixed to rod 454 in order to be moved linearly across a radial portion of the surface of substrate 408. Cover plate 418b is attached to rod 452 so that cover plate 418b may be independently moved to expose or isolate aperture 412 as necessary. It should be appreciated that process kit shield 410 in this embodiment has a slot defined across a diameter of the base so that aperture 412 may be moved anywhere along the slot through the movement of linear mask 418a to expose a region of substrate 408.

Figure 8B:
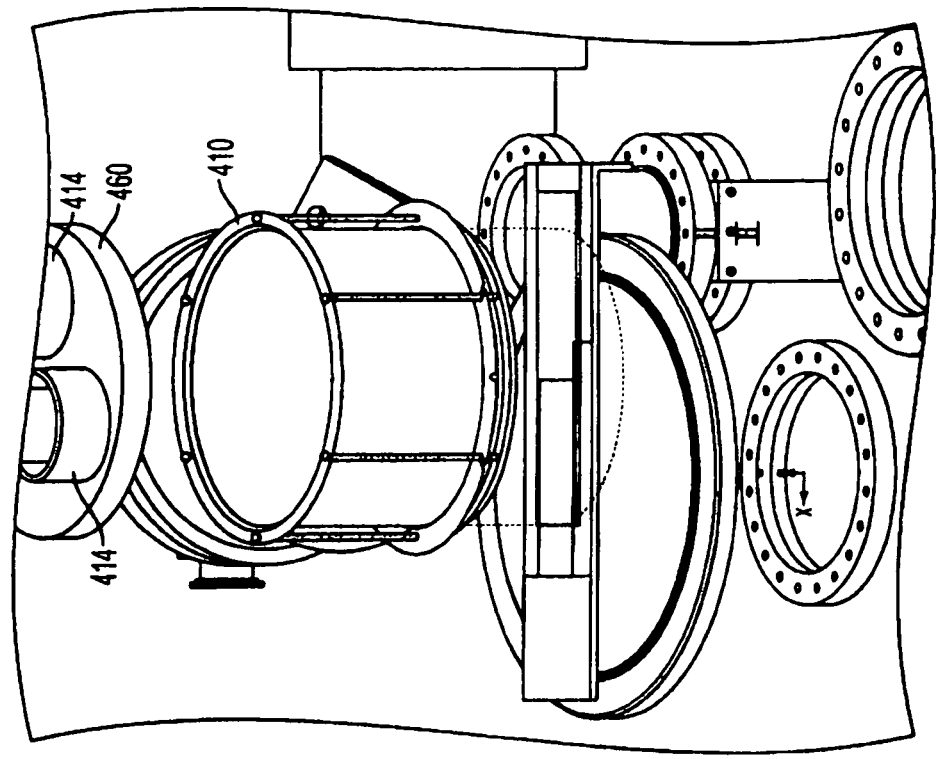
FIGS. 8A and 8B further illustrate the utilization of the linear mask and cover plate to expose and isolate an aperture for processing a substrate in a combinatorial fashion in accordance with one embodiment of the invention.
Figure 8A:
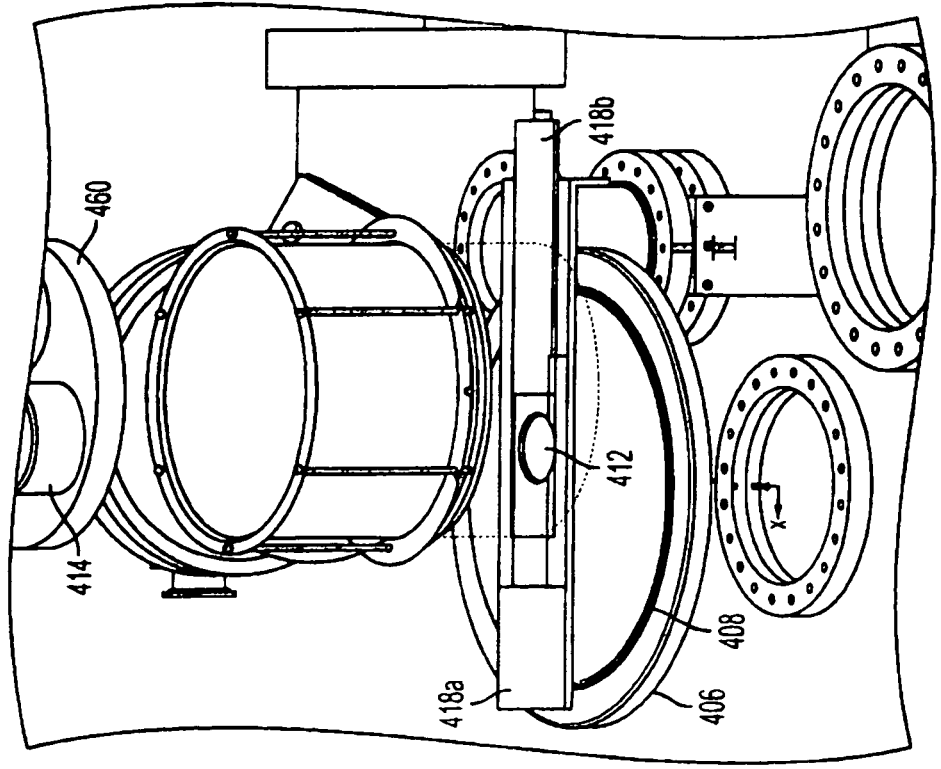

FIGS. 8A and 8B further illustrate the utilization of the linear mask and cover plate to expose and isolate an aperture for processing a substrate in a combinatorial fashion in accordance with one embodiment of the invention. Substrate support 406 supports substrate 408 over which process kit shield 410 isolates or confines a radial portion of the substrate for processing. It is noted that the kit shield may cover the entire substrate or only a portion thereof, as described above. Process kit shield 410 optionally includes a top plate 460 which may function as a datum shield having apertures for process heads 414. Linear mask 418a extends across a diameter of the base of process kit shield 410. The base of process kit shield 410 includes a slot defined across the base where the slot is preferably wider that aperture 412 so that aperture 412 of linear mask 418a defines the region to be processed. Linear mask 418a is moveable across the base plate to align with or define the region to be processed on the substrate. Cover plate 418b will slideably move over a surface of linear mask 418a in order to expose or cover aperture 412. In FIG. 8A, aperture 412 is exposed as cover plate 418b is retracted. In FIG. 8B, when cover plate 418b is moved forward aperture 412 is covered. As mentioned above, the isolation of the substrate by closing off aperture 412 will enable processing, chamber or head conditioning, pre-process steps, etc. within process kit shield 410 to occur without impacting substrate 408.

Figure 9:
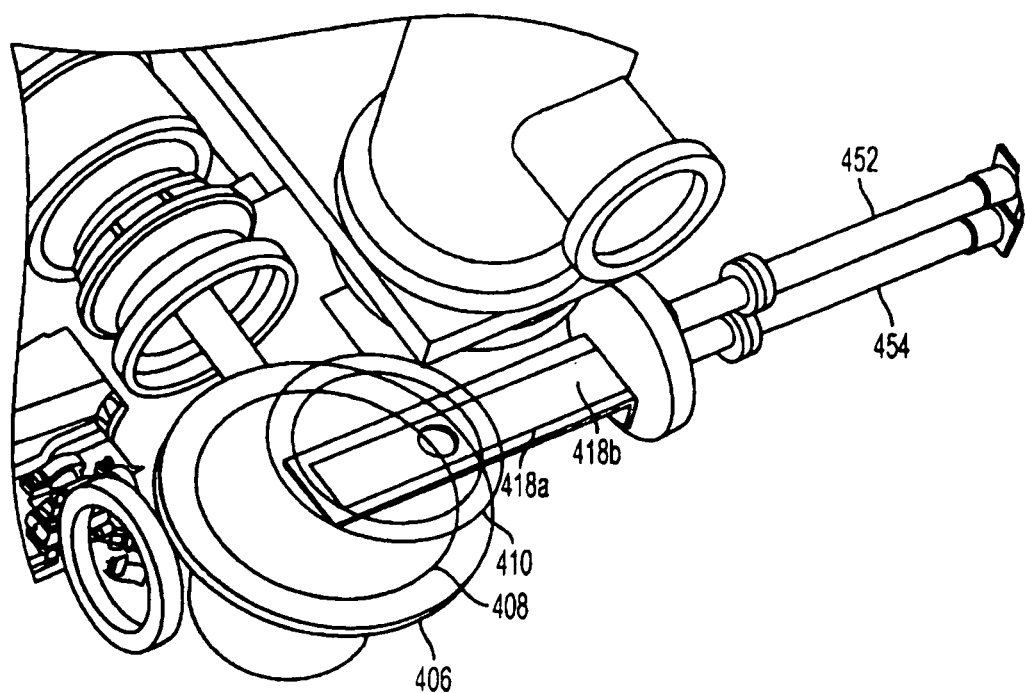
FIG. 9 is a simplified schematic diagram illustrating the linear mask and corresponding connection to movement rods in accordance with one embodiment of the invention.

FIG. 9 is a simplified schematic diagram illustrating the linear mask and corresponding connection to movement rods in accordance with one embodiment of the invention. Substrate support 406 has a substrate 408 disposed thereon. Linear mask 418a is disposed over a portion of substrate 408 and along a base of a process kit shield. Cover plate 418b slideably moves over a surface of linear mask 418a so that an aperture within the linear mask can be covered or uncovered by movement of cover plate 418b. Rod 452 is configured to control movement of cover plate 418b. In one embodiment, rod 452 may simply be a push rod attached to cover plate 418b in order to slideably push the cover plate across the grooved area within linear mask 418a. Rod 454 will likewise control movement of linear mask 418a over a surface of substrate 408 so that an aperture or apertures can be located over different regions of substrate 408 within the confined processing area defined by process kit shield 410. This operation can also be implemented with one mask or cover plate that enables the substrate to be covered in one position and allows placement of one or more apertures within the base plate of shield 410 in other positions. While this set up requires additional linear movement, it eliminates having multiple moving parts. In this or others systems described, the mask or cover plate could also be embedded within the base rather than riding on top as illustrated.

Figure 10A:
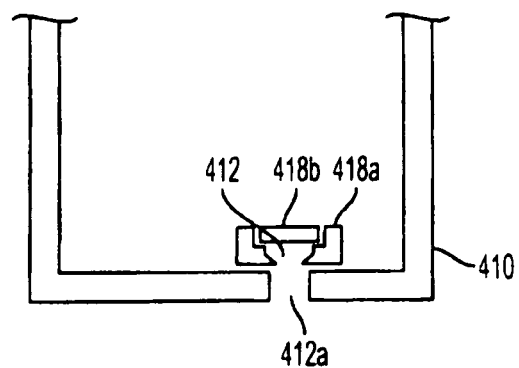
FIG. 10A is a simplified schematic diagram illustrating a cross sectional view of process kit shield and the linear mask in accordance with one embodiment of the invention.

FIG. 10A is a simplified schematic diagram illustrating a cross sectional view of process kit shield 410 with the linear mask in accordance with one embodiment of the invention. Process kit shield 410 includes a slot 412a extending across a base of process kit shield 410. In this embodiment, slot 412a extends across a diameter of the base of the process kit shield. Disposed over the slot is linear mask 418a having a slideable cover plate 418b. Linear mask 418a includes an aperture 412 which can be adjusted anywhere along slot 412a by moving the mask linearly across the opening of the base of shield 410. Aperture 412 may be any suitable shape. In one embodiment, cover plate 418b does not contact any surface of linear mask 418a. As illustrated in FIG. 10A, the inner surfaces defining aperture 412 may be chamfered or beveled in one embodiment.

One skilled in the art will appreciate that the gaps between the corresponding pieces are small enough so as to not light a plasma in accordance with one embodiment of the invention. For example, gaps between slide cover plate 418b and linear mask 418a may be approximately 1/50 of an inch. Similarly, a gap between a bottom surface of linear mask 418a and a top surface of the base of process kit shield 410 is approximately 1/50 of an inch. In one embodiment, a thickness of the base of process kit shield 410 is approximately 1/25 of an inch. In addition, process kit shield may be placed at a distance of approximately 1/50 of an inch above a surface of a substrate. Thus, the total distance from the bottom surface of linear mask 418a and a top surface of a substrate disposed under the base of the process kit shield 410 is about 2/25 of an inch. As mentioned above, the material of construction for process kit shield 410, linear mask 418a, and cover plate 418b may be ceramic or any suitable material compatible with the process materials and conditions may be utilized.

Figure 10B:
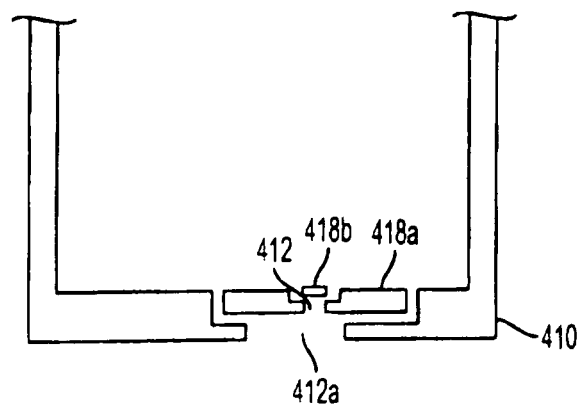
FIG. 10B is an alternative structural configuration for the base of the process kit shield of FIG. 10A.

FIG. 10B is an alternative structural configuration for the base of the process kit shield of FIG. 10A. The base of process kit shield 410 defines an opening or slot 412a. Disposed over slot 412a is linear mask 418a. The base of process kit shield 410 includes a shoulder defined along a length of slot 412a, where the shoulder provides support for linear mask 418a. Linear mask 418a includes aperture 412, which provides access to a surface of a substrate disposed under the base of process kit shield 410 when aligned over slot 412a. It should be appreciated that slot 412a is a fixed opening while aperture 412 is fixed within linear mask 418a, but moveable as dictated by the movement of linear mask 418a. As mentioned above, linear mask 418a may have multiple apertures and cover plate 418b may block access to one or more of the apertures depending on the processing circumstances. Linear mask 418a also includes a shoulder configured to support cover plate 418b. In one embodiment, linear mask 418a and cover plate 418b do not contact the shoulder surfaces over which they are disposed. It should be appreciated that the embodiment of FIG. 10B allow for a compact profile and the gaps between the corresponding pieces are small enough so as to not light a plasma, as described above. In addition, since linear mask 418a and cover plate 418b are substantially flush with the base plate, they will not perturb the plasma near the aperture which may affect the processing of the region. The embodiment of FIG. 10B may further be described as the base of process kit shield 410 having a recess defined over slot 412a that accommodates linear mask 418a. Linear mask 418a similarly includes a recess to accommodate cover plate 418b. In FIG. 10A linear mask 418a is disposed over a portion of the top surface of the base of process kit shield 410, while cover plate 418b is disposed within a recess of the top surface of linear mask 418a. In the embodiments where linear mask 418a and/or cover plate 418b are disposed in a recess, it should be appreciated that the sidewalls of the recess dictate the direction of movement of the corresponding linear mask or cover plate.

Figure 10C:
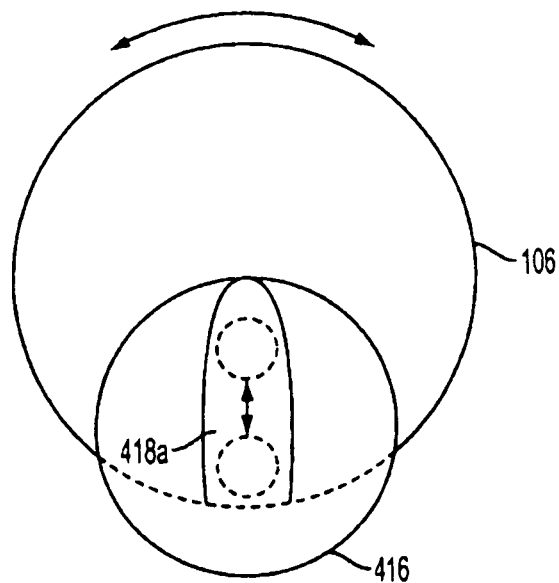
FIG. 10C is a simplified schematic diagram illustrating a top view of a processing chamber configured to combinatorially process a substrate disposed therein in accordance with one embodiment of the invention.

FIG. 10C is a simplified schematic diagram illustrating a top view of a processing chamber configured to combinatorially process a substrate disposed therein in accordance with one embodiment of the invention. Top portion 416, which contains the process kit shield is disposed over a portion of substrate support 106. Linear mask 418a is disposed within a slot of a base plate of the process kit shield. In the embodiment of FIG. 10C, the slot dictates the linear movement of linear mask 418a. That is, the configuration of the slot across the radius of substrate support 106 defines the linear movement of linear mask 418a over the radius. Thus, the entire surface of a substrate disposed on substrate support 106 is accessible due to the rotation of the substrate support and the linear movement of linear mask 418a. The aperture should preferably move across at least the radius of the substrate to enable complete access, but need not be limited to this range. It should be noted that the diameter of top portion 416 is configured to accommodate a length of the slot in the linear mask in one embodiment. That is, the length of the slot will determine the minimum diameter of the top portion.

Figure 10D:
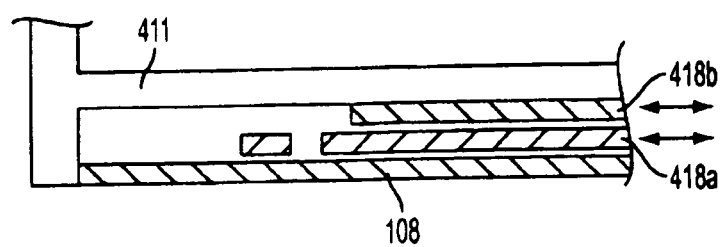
FIG. 10D is a simplified schematic of a cross sectional view of the base plate assembly for combinatorial processing in accordance with one embodiment of the invention.

FIG. 10D is a simplified schematic of a cross sectional view of the base plate assembly for combinatorial processing in accordance with another embodiment of the invention. It should be appreciated that in FIG. 10D, base 411 of the process kit shield has a slot defined therethrough (not shown). Below base 411 is cover plate 418b and linear mask 418a (which may also be referred to as a moving aperture plate), both of which move linearly independent of each other. As described above with reference to FIG. 10B, linear mask 418a and cover plate 418b may be disposed within recesses defined by shoulders as opposed to the stacked structure of FIG. 10D. In addition, in any of the above FIG. 10A, B or C, a shadow mask may be incorporated either above or below the base 411, the linear mask 418a, and the cover plate 418b to further limit the area within the processing region that is subject to the process. For example, multiple electrodes for capacitance or memory element testing may be incorporated into a single region using a shadow mask. If the mask is within the upper chamber 416, then it is preferably as thin as possible and substantially wider than the linear mask to avoid perturbing the plasma, but need not be.

Figure 11:
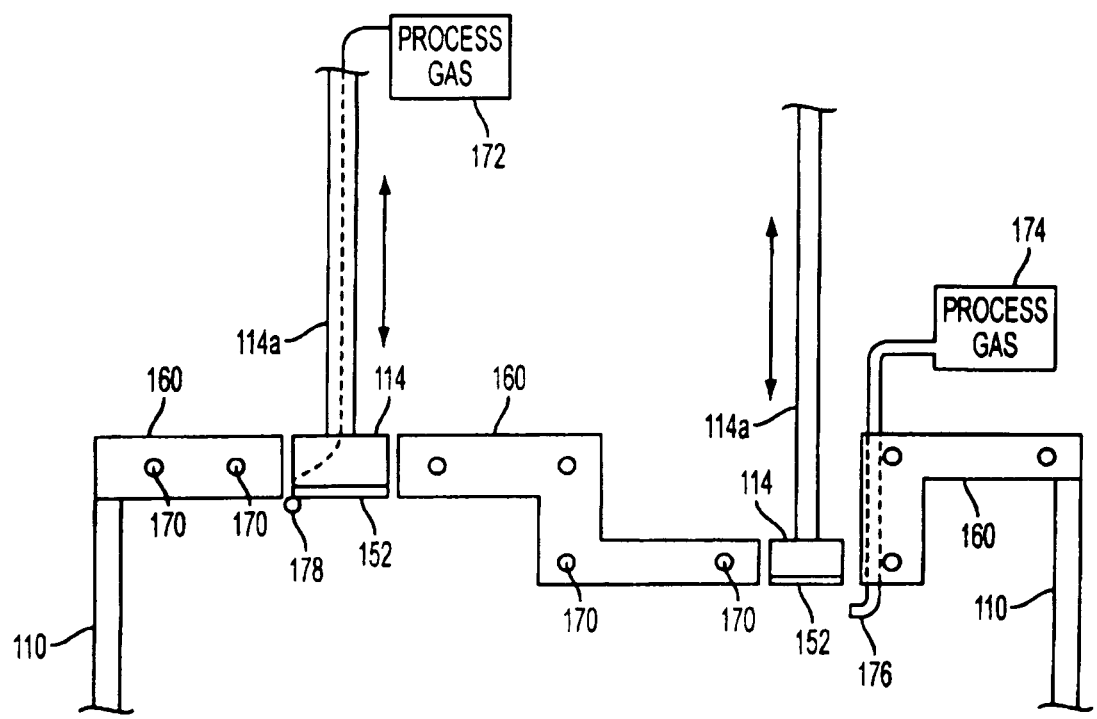
FIG. 11 is a simplified schematic diagram showing a cross-sectional view of a datum shield in accordance with one embodiment of the invention.

FIG. 11 is a simplified schematic diagram showing a cross-sectional view of a datum shield in accordance with one embodiment of the invention. Exemplary datum shield 160 provides for the process heads 114 or deposition guns to be positioned at different heights relative to a surface of a substrate below process kit shield 110. As mentioned above, use of a datum shield is optional and not necessary for the embodiments described herein. Where a datum shield is included, the datum shield may be planar which provides for similar heights for all deposition guns 114 as illustrated with reference to FIGS. 8A and 8B. Alternatively, datum shield 160 may enable different heights for each of the deposition guns as illustrated in FIG. 11. Datum shield 160 is disposed over process kit shield 110. Process heads 114 attach to arms 114a and are disposed within slots configured to accommodate the process heads within datum shield 160. Datum shield 160 may have a coolant supplied through conduit 170 disposed within the datum shield. Of course, the cooling feature is optional.

Process gas may be supplied from a process gas reservoirs 172 and 174 to corresponding process heads 114. In one embodiment, the process gas may be supplied through arm extensions 114a to process head 114. Nozzle 178 will then be utilized to supply process gas proximate to target 152 affixed to the process head. In an alternative embodiment, process gas is supplied through datum shield 160 into nozzle 176. As mentioned above, process heads 114 may move into and out of the openings defined within datum shield 160. In addition, slide cover plates may isolate the opening within the datum shield when the deposition head is removed from the opening as referenced in FIG. 1. In this manner, the process heads may be isolated from processing within process kit shield 110 as desired. Alternatively, other mechanisms such as hole fill or plugs may be implemented to provide this isolation. The process heads may be tilted from a vertical axis as described above. In one embodiment, some of the process heads may be titled while other within a cluster of process heads are not tilted but may be located at different heights from the surface of a substrate being processed. In one embodiment, datum shield 160 may move vertically to increase or decrease a distance from a surface of a substrate.

Figure 12:
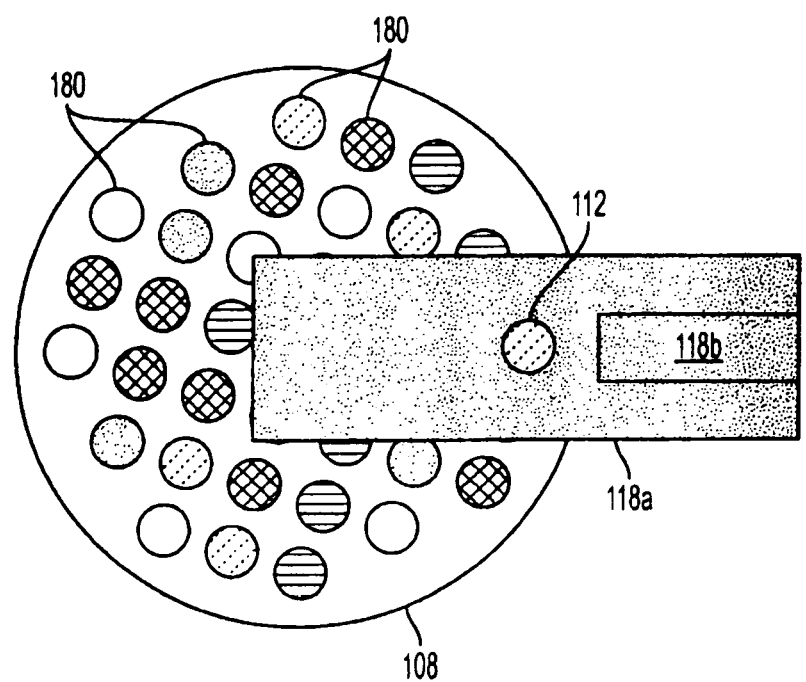
FIG. 12 is a simplified schematic diagram illustrating a pattern disposed over a substrate in accordance with one embodiment of the invention.

FIG. 12 is a simplified schematic diagram illustrating a pattern disposed over a substrate in accordance with one embodiment of the invention. In FIG. 12, an array of regions 180 are processed on substrate 108. In order to provide access to those regions for processing, between processing steps and per the experimental design aperture 112 is moved across a surface of substrate 108 within the slot in the base plate and the substrate is rotated as necessary so that multiple regions can be processed combinatorially on one substrate.

Figure 13:
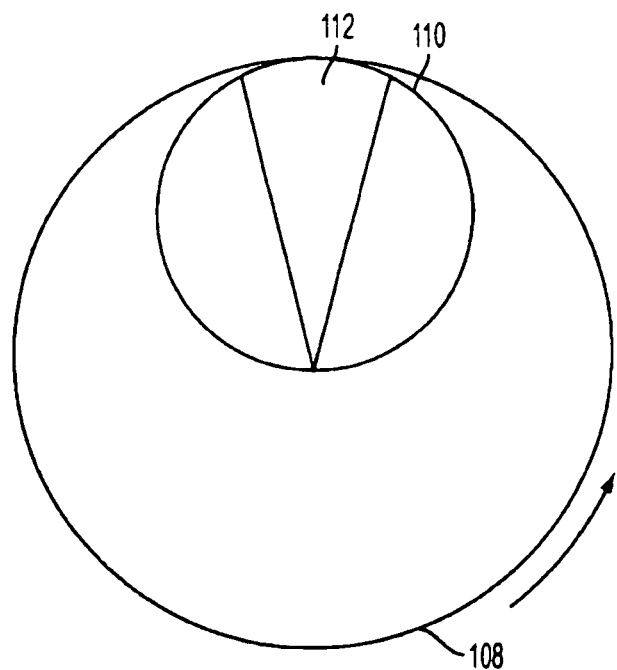
FIG. 13 is a simplified schematic diagram illustrating an aperture having an alternative configuration in accordance with one embodiment of the invention.

FIG. 13 is a simplified schematic diagram illustrating an aperture having an alternative configuration in accordance with one embodiment of the invention. Substrate 108 is disposed under process kit shield 110. Process kit shield 110 confines a radial portion of substrate 108 and includes a pie-shaped or triangular shaped aperture 112 defined within a base of the process kit shield. As substrate 108 rotates different regions of substrate 108 may be processed as exposed under aperture 112. In this embodiment, the substrate is rotated and stopped at a certain position, the processing takes place and then the substrate will then be rotated to a next position to process or deposit over a next region of the substrate. Process kit shield 110 may remain stationary in this embodiment. Thus, through the embodiments described herein, isolated and discrete regions of a substrate may be processed differently in a combinatorial fashion in order to evaluate unit processes, process sequence and materials in a combinatorial fashion.

Figure 14:
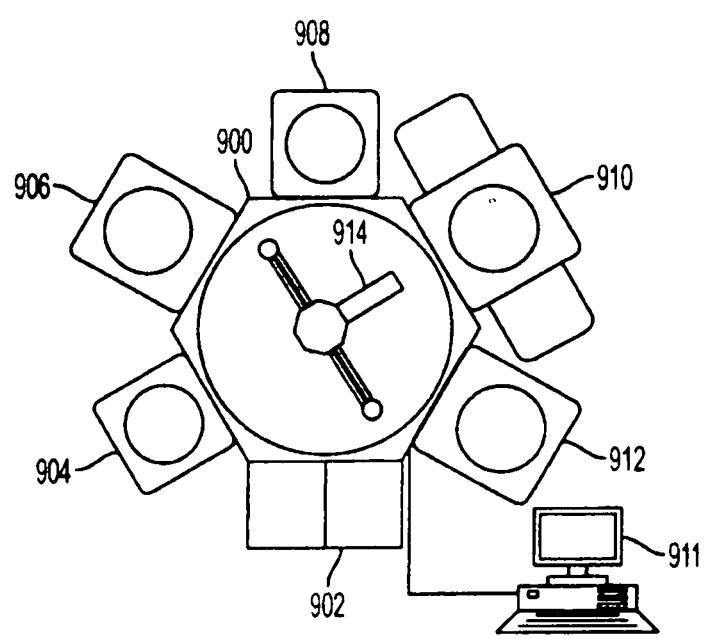
FIG. 14 a simplified schematic diagram illustrating an integrated high productivity combinatorial (HPC) system in accordance with one embodiment of the invention.

FIG. 14 a simplified schematic diagram illustrating an integrated high productivity combinatorial (HPC) system in accordance with one embodiment of the invention. HPC system includes a frame 900 supporting a plurality of processing modules. It should be appreciated that frame 900 may be a unitary frame in accordance with one embodiment. In one embodiment, the environment within frame 900 is controlled. Load lock/factory interface 902 provides access into the plurality of modules of the HPC system. Robot 914 provides for the movement of substrates (and masks) between the modules and for the movement into and out of the load lock 902. Modules 904-912 may be any set of modules and preferably include one or more combinatorial modules. For example, module 904 may be an orientation/degassing module, module 906 may be a clean module, either plasma or non-plasma based, module 908 and 910 may be combinatorial modules in according with this invention or of other design, and module 912 may provide convention clean or out-gassing as necessary for the experiment design.

Any type of chamber or combination of chambers may be implemented and the description herein is merely illustrative of one possible combination and not meant to limit the potential chamber or processes that can be supported to combine combinatorial processing or combinatorial plus conventional processing of a substrate/wafer. In one embodiment, a centralized controller, i.e., computing device 911, may control the processes of the HPC system. Further details of one possible HPC system are described in U.S. application Ser. Nos. 11/672,478 and 11/672,473. With HPC system, a plurality of methods may be employed to deposit material upon a substrate employing combinatoric processes.

Figure 15:
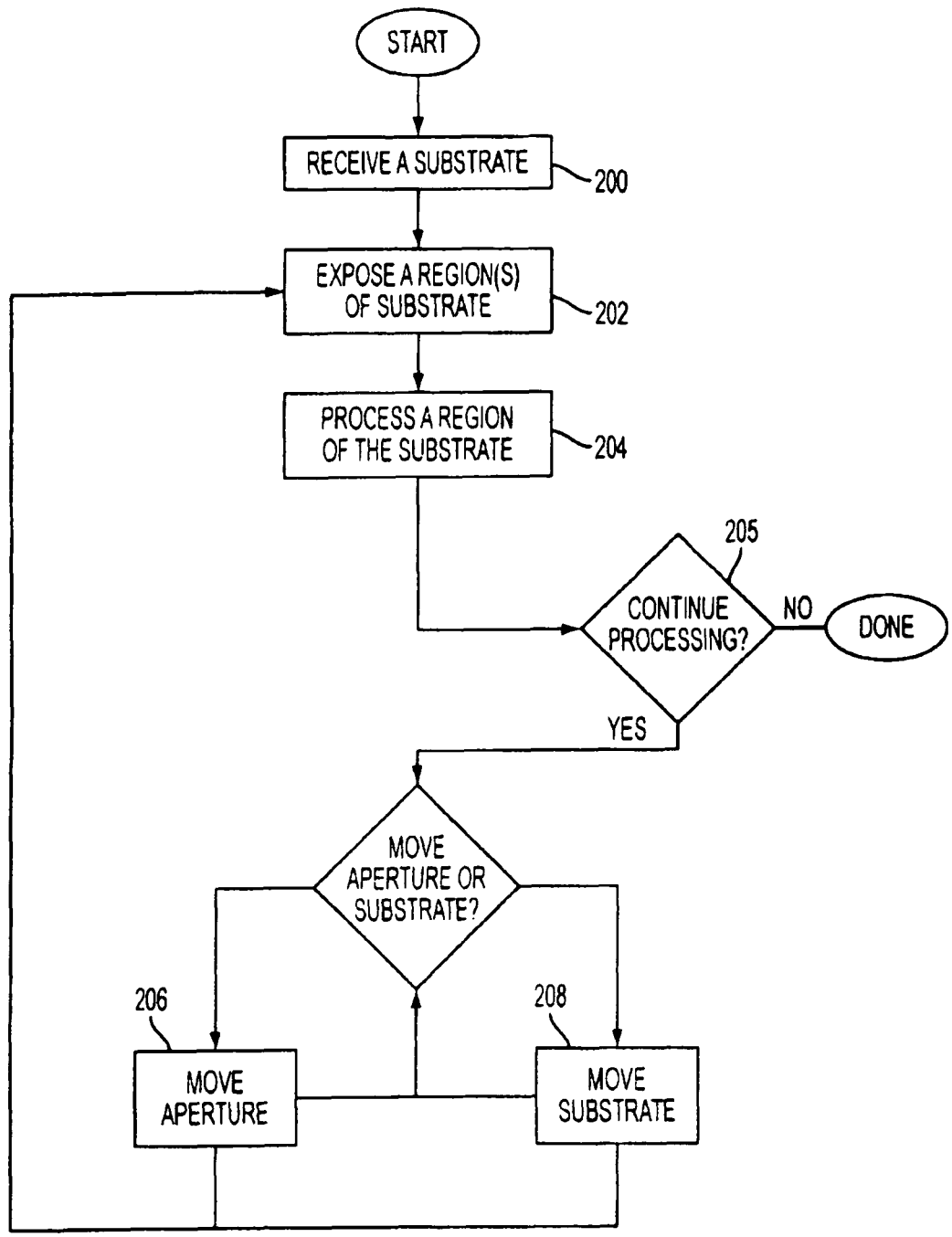
FIG. 15 is a flow chart diagram illustrating the method operations for combinatorially processing a substrate in accordance with one embodiment of the invention.

FIG. 15 is a flow chart diagram illustrating method operations for combinatorially processing a substrate in accordance with one embodiment of the invention. The method initiates with operation 200 where a substrate is received. As described above, the substrate may be received into a process tool having the ability to combinatorially process the substrate as described above. The method then advances to operation 202 where a portion of the substrate is exposed for processing through a base plate containing a fixed aperture. The process kit shield having a base with a fixed aperture described in FIGS. 1-3 or a slot with moveable linear mask and cover plate described in FIG. 4-9 are exemplary tools capable of exposing the portion of the substrate of operation 202. In each of these embodiments of the invention, a cover plate may be moved or adjusted to expose the aperture through the base plate and/or linear mask. The method then proceeds to operation 204 where the region of the substrate is processed. The process may include generating a plasma within the process kit shield over a radial portion of the substrate as described above, or other known methods to enable deposition, etching, cleaning, etc. or any other suitable processing operation. A region may have multiple process steps performed sequentially prior to moving to the next step or may only implement one process step. After process operation 204, it is determined whether to continue processing in decision operation 205. If processing does not continue, the method terminates. If processing continues, it is determined whether to move the aperture or the substrate. If the aperture is to be moved, either the process kit will be rotated or the linear mask and cover plate adjusted accordingly in operation 206. If the substrate is to be moved, the substrate support is rotated in operation 208. Once the aperture, for example, is moved, the method may determine whether the substrate also needs to be rotated or these operations may occur in parallel. Once the aperture and/or substrate have been moved the process returns to operation 202 and repeats as described above. Thus, the multiple regions on the substrate are processed in a combinatorial manner which includes different materials, different process conditions, different unit processes, or different process sequences being utilized for the multiple regions until the experiment is complete or there is not room on the substrate to create additional regions.

In summary, the embodiment described above may enable combinatorial processes to be applied to a substrate in a deposition system in one embodiment. A single process head or a cluster of process heads disposed within a chamber and opposing a substrate surface has access to the substrate surface through an opening in a base plate between the process head and the substrate surface. An axis of the process heads is substantially orthogonal to a planar surface of a substrate being processed or a planar surface of a substrate support upon which the substrate sits. It should be appreciated that where the substrate is not circular, e.g., a quadrilateral or other shape, the radial portion may be defined as a width or length of the substrate. The process heads of the embodiments defined herein are clustered over the radial portion, which in essence focuses on half of the substrate, to further improve the uniformity of a deposited layer, but need not be and may be cover more or less of the substrate per design choices.

The deposition embodiments may deposit multiple materials from corresponding targets, a single material from a single target, or any combinations thereof to achieve the combinatorial array of regions on a single substrate. For example, one application may include two titanium targets on respective process heads and a third process head having a nickel target. The two titanium targets would enable double the deposition rate with respect to a single titanium head. Varying combinations of titanium and nickel may be deposited in the different regions of the substrate and addition processing, such as reactive sputtering with oxygen, rapid thermal operations, doping or other post treatments may be conducted on the film. In another embodiment, another target, e.g., aluminum, hafnium, tantalum, tungsten or other known materials may be included on a fourth head and can be retracted during the titanium and nickel deposition so as to not be contaminated. The head can be brought into position and a layer can be deposited or the aluminum may be deposited in combination with the titanium and/or nickel. Accordingly, numerous combinations and permutations are enabled through the processing system described herein. As noted above, the system is capable of other processes in addition to depositing films and this is but one example or possible uses.

In addition, the combinatorial processing may be combined with conventional processing techniques to provide further data for material combinations, process sequence combinations, unit process combinations, and processing condition combinations on a single substrate. The embodiments described above enable control over a location of an aperture over the substrate, the size of the aperture, the shape of the aperture and the composition of the material deposited on the regions of the substrate. In addition, the embodiments described above allow for uniformity within the region, where the uniformity may be expressed as 1% of 1 sigma of non-uniformity.

Any of the operations described herein that form part of the invention are useful machine operations. The invention also relates to a device or an apparatus for performing these operations. The apparatus can be specially constructed for the required purpose, or the apparatus can be a general-purpose machine selectively activated or configured by a computer program stored in the computer. In particular, various general-purpose machines can be used with computer programs written in accordance with the teachings herein, or it may be more convenient to construct a more specialized apparatus to perform the required operations.

The method aspects of the invention can also be embodied as computer readable code stored on a computer readable medium to be executed as a recipe for the process tool described herein. The computer readable medium is any data storage device that can store data, which can be thereafter be read by a computer system. The computer readable medium also includes an electromagnetic carrier wave or other signals in which the computer code is embodied. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can also be distributed over a network-coupled computer system so that the computer readable code is stored and executed in a distributed fashion.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A combinatorial processing chamber, comprising:
a plurality of process heads operable to deposit a layer of material onto a substrate, the plurality of process heads clustered around a first axis, the plurality of process heads coupled to a rotatable assembly operable to rotate around a second axis;
a rotatable substrate support operable to rotate around a center axis and an off center axis;
a base plate located above the rotatable substrate support to allow a substrate to reside on the rotatable substrate support without the base plate contacting the substrate, the base plate having a single fixed opening for exposing a portion of the rotatable substrate support to one or more of the plurality of process heads; and
a moveable plate having a fixed aperture exposing a portion of the fixed opening, the moveable plate slidably located within a recess of the base plate.

2. The chamber of claim 1, wherein the base plate is located proximate to the rotatable substrate support such that the aperture defines a region on the substrate to be processed.

3. The chamber of claim 1, wherein the moveable plate includes multiple fixed apertures.

4. The chamber of claim 1, wherein the moveable plate has multiple fixed apertures of different sizes and wherein one of the multiple fixed apertures is exposed in the chamber during processing.

5. The chamber of claim 1 wherein the moveable plate is moveable in a plane defined above the substrate and limited by the fixed opening.

6. The chamber of claim 5 wherein planar movement of the base plate and rotation of the rotatable substrate support provide access to an entire surface of the substrate.

7. The chamber of claim 1 wherein rotation of the rotatable substrate support is at least 180 degrees.

8. The chamber of claim 1 further comprising:
a moveable cap for the fixed aperture.

9. The chamber of claim 8, wherein there are at least two fixed apertures and the moveable cap covers one of the at least two fixed apertures while another of the at least two fixed apertures provides access to a portion of the substrate.

10. The chamber of claim 8, wherein the moveable cap is located within a slot on the moveable plate such that a top surface of the moveable plate and a top surface of the moveable cap are substantially flush with the base plate.

11. The chamber of claim 1 wherein the fixed aperture is selected from a group of shapes consisting of round, quadrilateral, or pie shaped.

12. The chamber of claim 1, further comprising:
an outer sidewall extending from the base plate to define the chamber and an inner sidewall disposed within the outer sidewall, the inner sidewall having a diameter smaller than that of the rotatable substrate support, the inner sidewall being disposed between the rotatable substrate support and the plurality of process heads head wherein at least one of the inner sidewall or the outer side wall are moveable.

13. The chamber of claim 1, wherein a top surface of the moveable plate is substantially flush with a top surface of the base plate.

14. The chamber of claim 1, further comprising:
an isolation plate disposed to isolate the at least one process head from a processing region of the chamber, wherein the plurality of process heads is moveable in a direction orthogonal to a plane of movement of the isolation plate.

15. The chamber of claim 14, further comprising:
an extension housing a plurality of targets, the plurality of targets interchangeable with a target on one of the plurality of process heads while the isolation plate isolates the one of the plurality of process heads.

* * * * *